(12) United States Patent
Shukh

(10) Patent No.: US 8,331,141 B2
(45) Date of Patent: Dec. 11, 2012

(54) MULTIBIT CELL OF MAGNETIC RANDOM ACCESS MEMORY WITH PERPENDICULAR MAGNETIZATION

(76) Inventor: Alexander Mikhailovich Shukh, Savage, MN (US)

(*) Notice: Subject to any disclaimer, the term of this patent is extended or adjusted under 35 U.S.C. 154(b) by 144 days.

(21) Appl. No.: 12/844,475

(22) Filed: Jul. 27, 2010

(65) Prior Publication Data

US 2012/0155164 A1    Jun. 21, 2012

Related U.S. Application Data

(60) Provisional application No. 61/231,574, filed on Aug. 5, 2009.

(51) Int. Cl.
*G11C 11/15* (2006.01)
(52) U.S. Cl. ........ 365/173; 365/148; 365/158; 365/171; 365/172; 977/933; 977/935
(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 5,695,864 A | 12/1997 | Slonczewski | |
| 5,930,164 A | 7/1999 | Zhu | |
| 6,590,806 B1 | 7/2003 | Bhattacharyya | |
| 6,721,201 B2 | 4/2004 | Ikeda | |
| 6,911,710 B2 | 6/2005 | Nickel et al. | |
| 6,950,333 B2 | 9/2005 | Hiramoto et al. | |
| 7,006,375 B2 | 2/2006 | Covington | |
| 7,088,612 B2 | 8/2006 | Braun et al. | |
| 7,239,541 B2 | 7/2007 | Saito et al. | |
| 7,307,302 B2 | 12/2007 | Saito | |
| 7,313,013 B2 | 12/2007 | Sun et al. | |
| 7,420,839 B2 | 9/2008 | Ikeda et al. | |
| 7,432,574 B2 | 10/2008 | Nakamura et al. | |
| 7,440,339 B2 | 10/2008 | Nejad et al. | |
| 7,463,509 B2 | 12/2008 | Kim et al. | |
| 7,480,171 B2 | 1/2009 | Peng et al. | |
| 7,502,248 B2 | 3/2009 | Lim | |
| 7,532,505 B1 | 5/2009 | Ding | |

(Continued)

OTHER PUBLICATIONS

S. Mangin et al., Reducing the critical current for spin-transfer switching of perpendicular nanomagnets, Applied Physics Letters, v.94, 012502 (2009).

(Continued)

*Primary Examiner* — Alexander Sofocleous
*Assistant Examiner* — Harry W Byrne

(57) ABSTRACT

A multi-bit cell of magnetic random access memory comprises a magnetic tunnel junction element including a first and second free layer comprising a changeable magnetization oriented substantially perpendicular to a layer plane in its equilibrium state and a switching current, a first and second tunnel barrier layer, and a pinned layer comprising a fixed magnetization oriented substantially perpendicular to a layer plane, the pinned layer is disposed between the first and second free layers and is separated from the free layers by one of the tunnel barrier layers, a selection transistor electrically connected to a word line, and a bit line intersecting the word line. The magnetic tunnel junction element is disposed between the bit line and the selection transistor and is electrically connected to the bit line and the selection transistor, wherein the first and second free layers have substantially different switching currents.

14 Claims, 7 Drawing Sheets

| Pinned Layer 32 | Free Layer 112 | Free Layer 122 | MR Element Resistance |
|---|---|---|---|
| ↑ | ↑ | ↑ | R1+R2 |
| ↑ | ↓ | ↑ | R1+R2+ΔR1 |
| ↑ | ↑ | ↓ | R1+R2+ΔR2 |
| ↑ | ↓ | ↓ | R1+R2+ΔR1+ΔR2 |

U.S. PATENT DOCUMENTS

| | | | |
|---|---|---|---|
| 7,539,047 | B2 | 5/2009 | Katti |
| 7,596,015 | B2 * | 9/2009 | Kitagawa et al. ............. 365/158 |
| 8,098,514 | B2 * | 1/2012 | Nagase et al. ................ 365/158 |
| 8,107,281 | B2 * | 1/2012 | Kai et al. ...................... 365/158 |
| 8,208,292 | B2 * | 6/2012 | Kai et al. ...................... 365/158 |
| 2009/0251951 | A1 * | 10/2009 | Yoshikawa et al. .......... 365/158 |

OTHER PUBLICATIONS

M. Nakayama et al., Spin transfer switching in TbCoFe/CoFeB/MgO/CoFeB/TbCoFe magnetic tunnel junctions with perpendicular magnetic anisotropy, JAP, v. 103, 07A710 (2008).

H. Ohmori et al., Perpendicular magnetic tunnel junction with tunneling magnetoresistance ration of 64% using MgO . . . , JAP vol. 103, 07A911 (2008).

Z. Li et al., Perpendicular Spin Torques in Magnetic Tunnel Junctions, Physical Review Letters, vol. 100, 246602 (2008).

T. Hatori et al., MTJ Elements With MgO Barrier Using RE-TM Amorphous Layers for Perpendicular MRAM, IEEE Trans. Magn., v. 43, No. 6, p. 2331 (2007).

X. Zhu and J.-G. Zhu, Spin Torque and Field-Driven Perpendicular MRAM Designs Scalable to Multi-Gb/Chip Capacity, IEEE Trans. Magn, v. 42, No. 10, p. 2739 (2006)

Z. Diao et al., Spin transfer switching and spin polarization in magnetic tunnel junctions with MgO and Al2O3 barriers, App. Phys. Letters, v. 87, 232502 (2005).

* cited by examiner

| Pinned Layer 32 | Free Layer 112 | Free Layer 122 | MR Element Resistance |
|---|---|---|---|
| ↑ | ↑ | ↑ | R1+R2 |
| ↑ | ↓ | ↑ | R1+R2+ΔR1 |
| ↑ | ↑ | ↓ | R1+R2+ΔR2 |
| ↑ | ↓ | ↓ | R1+R2+ΔR1+ΔR2 |

MULTIBIT CELL OF MAGNETIC RANDOM ACCESS MEMORY WITH PERPENDICULAR MAGNETIZATION

CROSS-REFERENCE TO RELATED APPLICATION

This invention claims benefit of U.S. Provisional Patent Application No. 61/231,574 entitled "Multi-bit Magnetic Random Access Memory Cell" filed Aug. 5, 2009, which is hereby incorporated by reference in its entirety.

FEDERALLY SPONSORED RESEARCH

Not Applicable

SEQUENCE LISTING OR PROGRAM

Not Applicable

FIELD OF THE INVENTION

The present invention relates to a magnetic random access memory (MRAM) and, more specifically, to multi-bit memory cell of MRAM with a perpendicular magnetization.

BACKGROUND OF THE INVENTION

Magnetic random access memory (MRAM) is a new memory technology that will likely provide a superior performance over existing semiconductor memories including flash memory and may even replace hard disk drives in certain applications requiring a compact non-volatile memory device. In MRAM bit of data is represented by a magnetic configuration of a small volume of ferromagnetic material. Magnetic state of the ferromagnetic material can be measured during a read-back operation. The MRAM typically includes a two-dimensional array of memory cells wherein each cell comprises one magnetic tunnel junction (MTJ) element that can store at least one bit of data, one selection transistor (T) and intersecting conductor lines (so-called 1T-1MTJ design).

Conventional MTJ element represents a patterned thin film multilayer that includes at least a pinned magnetic layer and a free magnetic layer separated from each other by a thin tunnel barrier layer. The free layer has two stable orientations of magnetization that are parallel or anti-parallel to the fixed orientation of magnetization in the pinned layer that correspond to two logic states "0" or "1". Resistance of the MTJ element depends on the mutual orientation of the magnetizations in the free and pinned layers and can be effectively measured. A resistance difference between the parallel and anti-parallel states can exceed 600% at room temperature.

FIG. 1 shows a schematic view of memory cell 10 for storing four logic states according to a prior art disclosed in U.S. Pat. No. 5,930,164 (Zhu). The cell 10 includes two MTJ elements 11 and 12 connected in series and magnetically separated from each other by a conductive layer 13 made of a non-magnetic material. First MTJ element 11 comprises a first pinned layer 111 and a first free layer 112 made of CoFe and NiFeCo, respectively. Both the layers 111 and 112 are about 50 Å thick. A tunnel barrier layer 113 separates the layers 111 and 112 from each other. The layer 113 is made of $Al_2O_3$ and has a thickness of 22-30 Å. Second MTJ element 12 has a second pinned layer 121 and a second free layer 122 separated from each other by a second barrier layer 123. The second pinned layer 121 and the second free layer 122 have 50 Å and 30 Å in thickness, respectively. The second free layer 122 is thinner than the first free layer 112. This difference provides the free layers 112 and 122 of the MTJ elements 11 and 12 with different hysteresis (or switching) characteristics. The second tunnel barrier layer 123 is made thinner than the first tunnel barrier layer 113. That results in different resistance values of MTJ elements 11 and 12. Thickness of the layer 123 is in a range of 15-22 Å. The pinned layers 111 and 121 are magnetically pinned by anti-ferromagnetic layers (not shown), which are placed adjacent their external surfaces.

A current source 14 is coupled to the MRAM cell 10 to provide a sense current 15 through the MTJ elements 11 and 12 to a common ground terminal 16. A resistance over cell 10 varies according to the magnetic states of the free layers 112 and 122; thereby a voltage output $V_{OUT}$ over the MRAM cell 10 indicates different values. The output signal $V_{OUT}$ is compared to threshold voltages, which are predetermined from hysteresis characteristics of the cell 10 for identification of recorded data. One of several disadvantages of the cell 10 is a large length-to-width aspect ratio of the MTJ elements 11 and 12 that substantially reduces a storage density of MRAM chip.

FIG. 2 shows a schematic view of a magnetoresistive element 20 comprising two MTJ elements 11 and 12 according to prior art disclosed in U.S. Pat. No. 6,590,806 (Bhattacharyya). The element 20 distinguishes from the cell 10 shown in FIG. 1 by using a common pinned layer 22 for two MTJ elements 11 and 12. The pinned layer 22 has a structure of a synthetic antiferromagnet (SAF). The SAF pinned layer 22 is composed of two magnetic layers 111 and 121 antiferromagnetically coupled to each other through 0.5-1.0 nm thick layer 221 of Ruthenium (Ru) or Copper (Cu). The SAF structure of the pinned layer 22 allows a reduction of length-to-width aspect ratio. However this reduction is not sufficient for high density MRAM.

Both MRAM elements according to prior art shown in FIG. 1 and FIG. 2 employ field induced switching mechanism of the free layers 112 and 122 that is based on use of two orthogonal magnetic fields. The field induced switching mechanism suffers from high write current, a large and complicated cell design and causes a serious half-selected cells problem in MRAM array and in the memory cells with two free layers, especially. Besides, the memory elements 10 shown on the FIGS. 1 and 20 shown on the FIG. 2 employ magnetic materials with in-plane magnetization that limit their thermal stability a scalability at technology node below 90 nm.

What is needed is a simple design of multi-bit memory cell having a high thermal stability, small cell size, excellent scalability and low switching current; the memory cell that does not suffer from a half-selection problem.

SUMMARY OF THE INVENTION

The present invention provides a multi-bit cell of magnetic random access memory with perpendicular magnetization.

A magnetic memory cell according to an aspect of the present invention comprises a magnetic tunnel junction element including a first and second free layer comprising a changeable magnetization oriented substantially perpendicular to a layer plane in its equilibrium state and a switching current, a first and second tunnel barrier layer, and a pinned layer comprising a fixed magnetization oriented substantially perpendicular to a layer plane, the pinned layer is disposed between the first and second free layers and is separated from the free layers by one of the tunnel barrier layers; a selection transistor electrically connected to a word line, and a bit line intersecting the word line; the magnetic tunnel junction element is disposed between the bit line and the selection transistor and is electrically connected to the bit line and the selection transistor, wherein the first and second free layers have substantially different switching currents.

A method of writing to a magnetic random access memory according to another aspect of the present invention comprises: providing a magnetic tunnel junction element including a first and second free layer comprising a changeable magnetization oriented perpendicular to a layer plane in its equilibrium state and a switching current, a first and second tunnel barrier layer, and a pinned layer comprising a fixed magnetization oriented substantially perpendicular to a layer plane; the pinned layer is disposed between the first and second free layers and is separated from the free layers by one of the tunnel barrier layers; driving a bias current pulse through a bit line in a proximity to but not through the magnetic tunnel junction element for producing a bias magnetic field along a hard magnetic axis of the pinned, first free and second free layers, and driving a switching current pulse through the magnetic tunnel junction element along an easy axis of the pinned, first free and second free layers for producing a spin momentum transfer, wherein the switching current pulse substantially superimposes the bias current pulse, and the first and second free layers have substantially different switching currents.

DESCRIPTION OF THE PREFERRED
EMBODIMENTS

In the following detailed description of the preferred embodiments, reference is made to the accompanying drawings that form a part hereof, and in which are shown be way of illustration specific embodiments in which the invention may be practiced. It is understood that other embodiments may be utilized and structural changes may be made without departing from the scope of the present invention.

The leading digits of reference numbers appearing in the Figures generally corresponds to the Figure number in which that component is first introduced, such that the same reference number is used throughout to refer to an identical component which appears in multiple Figures.

Figure 1:
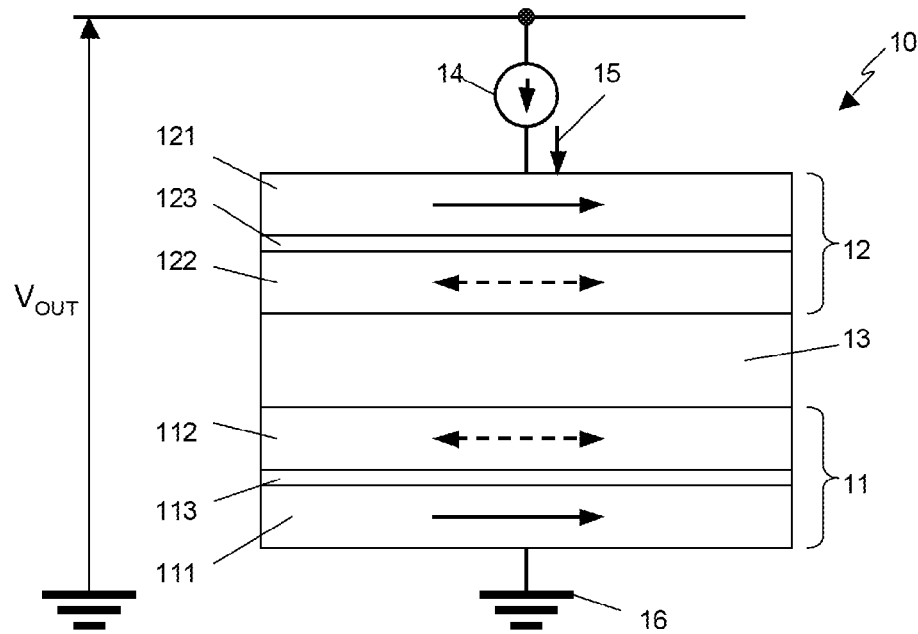
FIG. 1 shows a schematic cross-section view of multi-bit MRAM cell with in-plane magnetization in free and pinned layers according to a prior art.
Figure 2:
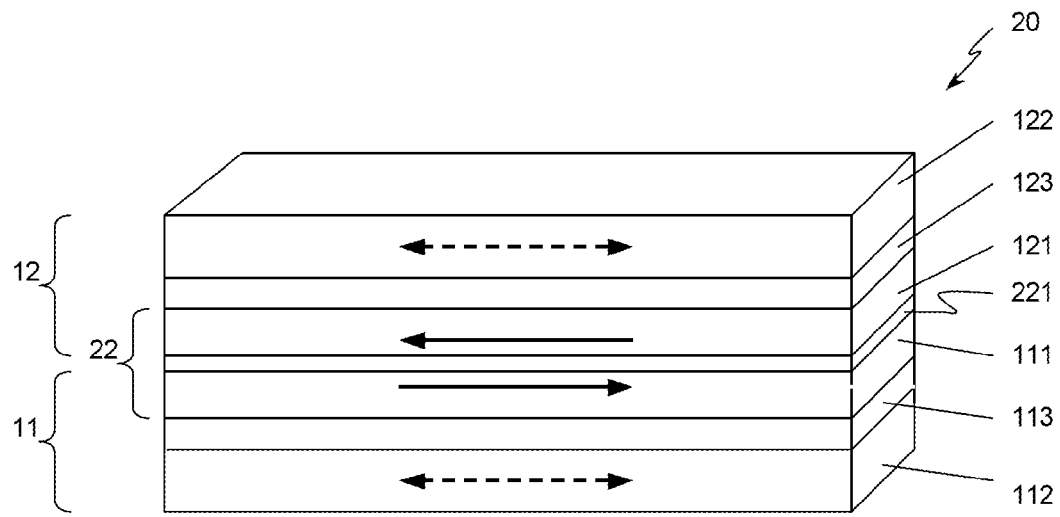
FIG. 2 shows a schematic cross-sectional view of multi-bit magnetoresistive element with one pinned layer having a structure of a synthetic antiferromagnet according to prior art.
Figure 3:
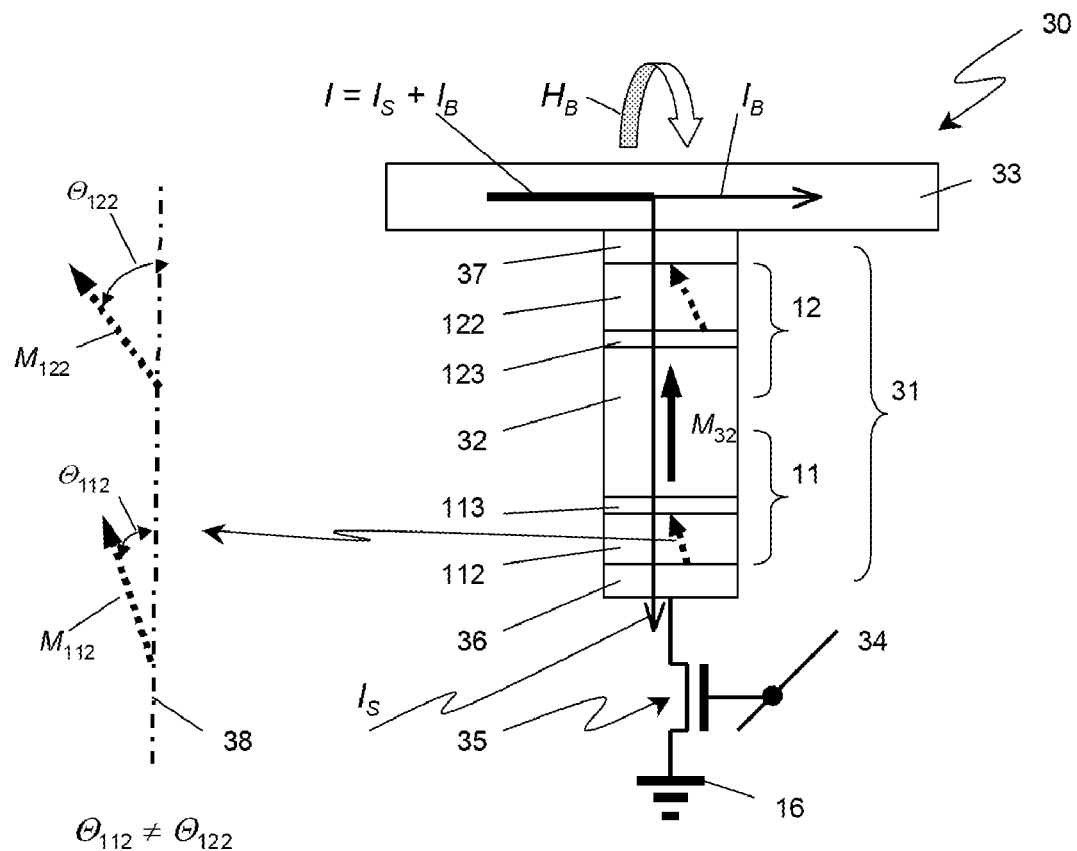
FIG. 3 shows a schematic cross-sectional view of a multi-bit memory cell with a perpendicular magnetization according to an embodiment of the present invention.

FIG. 3 shows schematic cross-sectional view of memory cell 30 according to an embodiment of the present invention. The cell 30 includes a magnetoresistive (MR) element 31, a bit line 33, a word line 34 and a selection transistor 35. The MR element 31 is placed between the bit line 33 and the selection transistor 35 and is electrically connected with them in series by means of conducting seed 36 and cap 37 layers. The word line 34 is connected to a gate of the transistor 35 and intersects the bit line 33. The MR element 31 comprises two magnetic tunnel junction (MTJ) elements 11 and 12 connected in series. The MTJ element 11 includes a free layer 112 with changeable magnetization $M_{112}$ (shown by arrow) that is oriented substantially perpendicular to a layer plane in its equilibrium state, a pinned layer 32, and a tunnel barrier layer 113 disposed between the layers 112 and 32. The pinned layer 32 has a fixed magnetization $M_{32}$ that is oriented substantially perpendicular to a layer plane. The MTJ element 12 comprises a free layer 122 with a changeable magnetization $M_{122}$ (shown by arrow) that is oriented substantially perpendicular to a layer plane in its equilibrium state, the pinned layer 32 and a tunnel barrier layer 123 placed between the layers 123 and 32.

In the equilibrium state the magnetizations $M_{112}$, $M_{32}$ and $M_{122}$ are collinear (parallel or antiparallel to each other). To write a data to the free layers 112 or 122 a spin-polarized current $I_S$ is applied to the MR element 31 in direction perpendicular to a layer plane. The spin-polarized current $I_S$ produces a spin momentum transfer in the free layers 112 and 122 and might cause a magnetization reversal in the free layers from up to down orientation or vice-versa. The orientation of magnetization in the free layers 112 and 122 is controlled by the direction of the spin-polarized current $I_S$. To reverse the magnetization in the free layer the magnitude of the spin-polarized current should exceed a critical current that depends on volume and magnetic properties of the free layer, and other parameters. The critical current of the spin-transfer reversal in free layer of MTJ element with perpendicular magnetization at zero temperature is given by $$I_{C0} = -\left(\frac{2e}{\hbar}\right)\frac{\alpha M_S V}{g(\theta)p}H_{EFF}, \quad (1)$$

where $M_S$ and V are a saturation magnetization and a volume of the free layer, α is Gilbert's damping constant, p is the spin polarization of the current, and $H_{EFF}$ is an effective magnetic field acting on the free layer. The factor $g(\Theta)$ depends on the relative angle $\Theta$ between the magnetizations of the pinned and free layers.

According to the equation (1) the switching current of the free layer can be effectively controlled by the volume V and/or the magnetization saturation $M_S$ of the free layer. Besides, the critical current depends on the spin polarization p of electrons running through the free layer and on a mutual orientation of the magnetizations in the free and pinned layers. The dependence of the critical switching current $I_{C0}$ on several parameters provides lot of possibilities for controlling the switching parameters of the free layer. For instance, to insure an independent and controllable reversal of the magnetization in the free layers 112 and 122 affected by the same spin-polarized current $I_S$ the layers should have at least one or several different parameters, such as a layer thickness, the magnetization saturation $M_S$ of magnetic material, magnetic anisotropy $H_K$, etc.

Figures 4, 5:
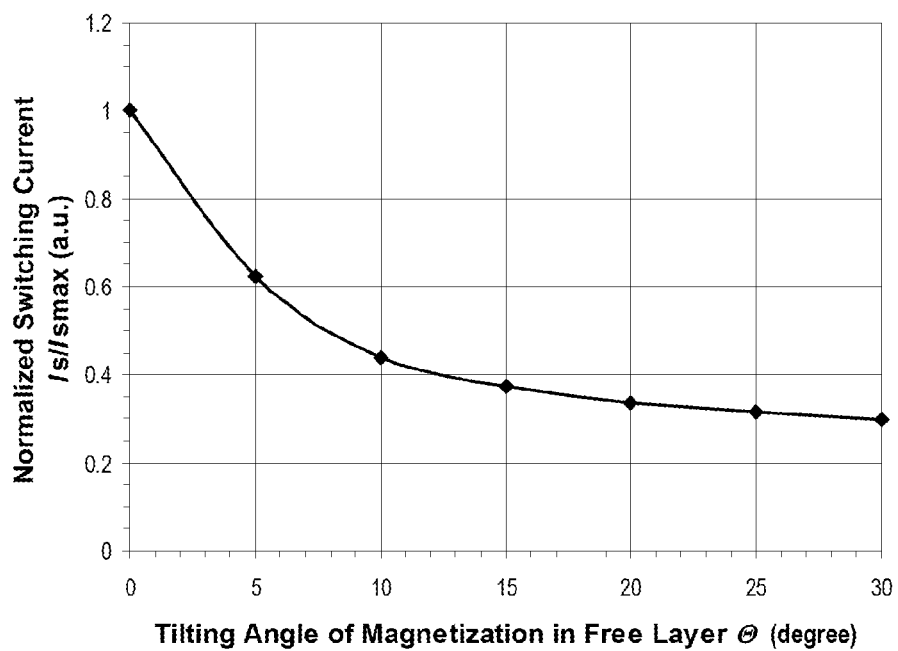
FIG. 4 illustrates a table of resistance values corresponding to relative orientation of magnetization in the free layers of the memory cell shown in FIG. 3.
FIG. 5 is a graph illustrating a simulated dependence of normalized magnitude of a spin-polarized switching current on tilting angle of magnetization in the free layer relatively to an axis perpendicular to a layer plane.

The MR element 31 comprises two free layers 112 and 122. Each of the layers has two logic states "0" or "1". Hence the MR element 31 can have up to four possible logic states that are shown in the FIG. 4. At the condition of $\Delta R1 = \Delta R2$, where $\Delta R1$ and $\Delta R2$ is a magnetoresistance of the MTJ elements 11 and 12, respectively, the number of possible logic states will be reduced up to three since the logical states $R1+R2+\Delta R1$ and $R1+R2+\Delta R2$ will be not distinguishable, where R1 and R2 is a resistance of the MTJ elements 11 and 12. To provide the MR element 31 with four distinguishable logic states the magnetoresistance of the MTJ elements 11 and 12 should be substantially different $\Delta R1 \neq \Delta R2$. The magnetoresistance $\Delta R$ of the MTJ elements significantly depends on a thickness and on material properties of the tunnel barrier layers 113 and 123. By varying the thickness of the tunnel barrier layers or the material of the layers, or both parameters simultaneously the difference in the magnetoresistance of the MTJ elements 11 and 12 can be made significant. Besides, the magnetoresistance can be controlled by a material selection of the pinned and free layers.

According to the equation (1) the critical current $I_{C0}$ can be controlled by an angle $\Theta$ between the magnetizations in the free and pinned layers. To facilitate a reversal magnetization in the free layer, the layer is made of magnetic material or multilayer that has a relatively low magnetic anisotropy. Hence the orientation of the magnetization in the free layer can be tilted by an external magnetic field applied along a hard axis of the free layer that is resting in the layer plane. Computed dependence of the normalized switching current on the angle $\Theta$ is given in FIG. 5. The received results suggest that the switching current can be reduced almost twice at the tilt angle $\Theta=8$ degree.

To provide the memory cell 30 with four logic states the tunnel barrier layers 123 and 113 made of MgO received different thickness, for instance the layer 113 is 0.9 nm thick and the thickness of the layer 123 is 1.2 nm. That will result in of about 100% difference in the magnetoresistance. Similar results can be achieved by using the free layers 112 and 122 made of different magnetic materials such as CoFeB and CoFe/NiFe at the same thickness of the tunnel barrier layers 113 and 123.

The memory cell 30 according to the present invention is using a hybrid switching mechanism. The mechanism assumes a combined effect of the bias magnetic field and the spin-polarized current simultaneously affecting the free layer. For instance, the free layer 122 of the MTJ 12 is made of magnetic material with a lower crystalline anisotropy than that of the layer 112. To write a data to the free layer 122 the bias current $I_B$ is applied to the bit line 33. The current $I_B$ is running in the vicinity of the MR element 31 but not through the element. The current $I_B$ induces a bias magnetic field $H_B$ that is applied along a hard axis of the layers 122, 32 and 112. Since the pinned layer 32 is made of a hard magnetic material its magnetization $M_{32}$ is fixed and does not change under the effect of the relatively weak magnetic field $H_B$. Magnitude of the bias magnetic field $H_B$ is inverse proportional to a distance from the bit line 33. Therefore the free layer 122 placed adjacent to the bit line 33 is experienced to the slightly higher magnetic field than the remote free layer 112. However the difference in the bias field magnitude is small and can be neglected. The bias field $H_B$ tilts the magnetization $M_{122}$ relatively to its equilibrium position along an axis 38 that is perpendicular to the layer plane on angle $\Theta_{122}$. The tilt angle $\Theta_{112}$ is substantially smaller due to the higher anisotropy (coercivity) of the free layer 112. The transistor 35 turns on by applying a voltage to its gate through a word line 34. The spin-polarized current $I_S$ runs through the MR element 31. The current $I_S$ produces a spin momentum transfer from the spin-polarized electrons to the free layers 112 and 122. The critical switching currents of the layers 112 and 122 are substantially different due to different material properties and/or dimension the layers. The current $I_S$ is insufficient to reverse the magnetization $M_{112}$ in the layer 112 but it is strong enough to cause the reversal of the magnetization $M_{122}$ in the free layer 122. As a result, the data is written to the layers 122 only.

Figure 6:
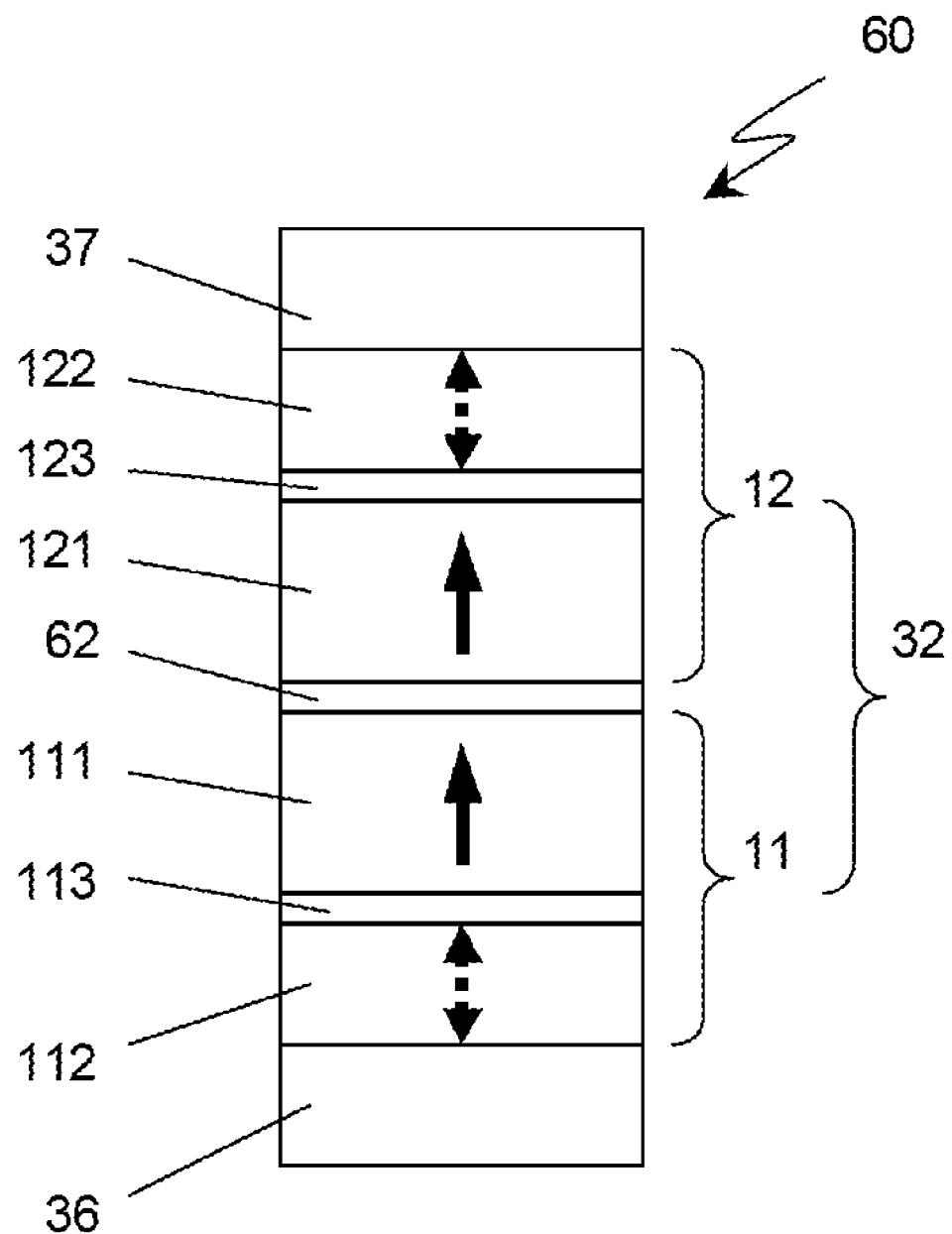
FIG. 6 shows a schematic cross-section view of multi-bit MTJ element with two pinned layers according to another embodiment of the present invention.

FIG. 6 shows a schematic cross-sectional view of a multi-bit MR element 60 according to another embodiment of the present invention. The MR element includes two pinned layers 111 and 121 separated from each other by a conductive nonmagnetic spacer layer 62. Thickness of the conductor spacer 62 could be any in a range from 0.5 nm to 100 nm or even higher. At the thickness of the layer 62 of about 0.8 nm made of Ruthenium (Ru) or similar materials the pinned layers 111 and 121 will have a strong antiferromagnetic coupling between each other. At the thickness of the layer 62 above 5 nm the layers 111 and 121 will be experienced to a weak magnetostatic coupling. Variation of the layer 62 thickness provides a possibility to control a fringing field produced by the pinned layer that affect an operation of the free layer.

Figure 7A:
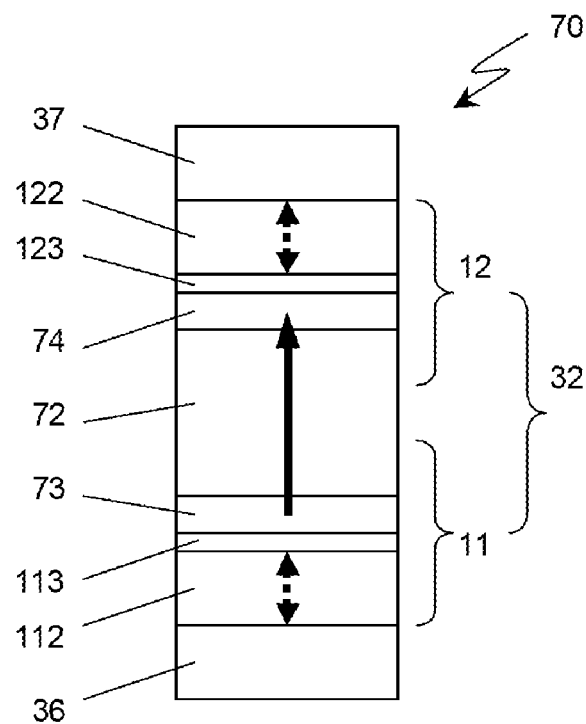
FIGS. 7A-7B show schematic cross-sectional views of multi-bit MTJ element with enhanced spin polarization of pinned layer according to yet other embodiments of the present invention.
Figure 7B:
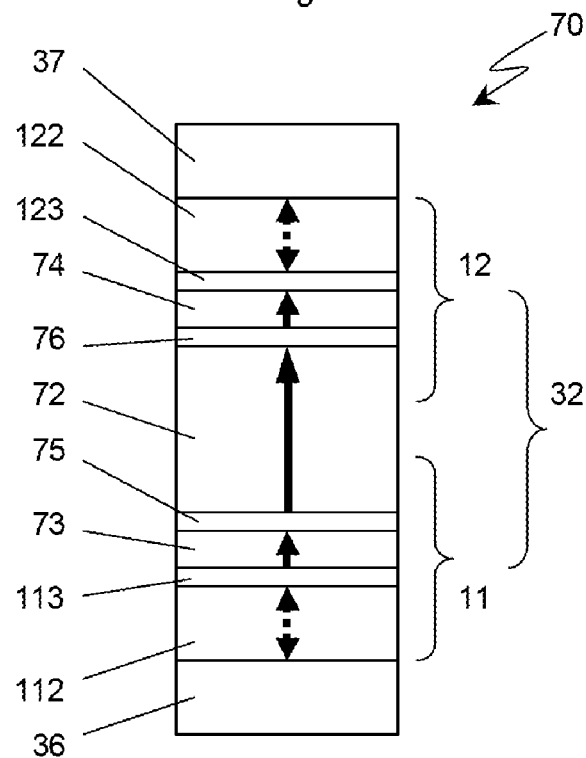

FIGS. 7A and 7B show a multi-bit MR element 70 with an improved spin-polarization of the pinned layer 32. The spin-polarization is important for reduction of critical current amplitude and for increase of read back signal of the MR element. The pinned layer 32 includes a reference layer 72 with a fixed magnetization oriented substantially perpendicular to a layer plane and two spin-polarizing layers 73 and 74 positioned between the reference layer 72 and the tunnel barrier layers 113 and 123, respectively. The spin-polarized layers are made of magnetic material with a high spin-polarization such as CoFe, CoFeB, Fe or similar. The layers 73 and 74 have a strong magnetic coupling with the reference layer 72 to provide them with a substantial perpendicular magnetization that will be not tilted during write operation under the bias magnetic field $H_B$. The spin-polarizing layers 73 and 74 could be made of a magnetic material with either perpendicular or in-plane anisotropy. To provide a possibility of exchange coupling control between the reference layer 72 and the spin polarizing layers 73 and 74 the MR element 70 shown in the FIG. 7B includes thin spacer layers 75 and 76, respectively. The layers 75 and 76 are disposed between the reference layer 72 and the spin polarizing layer 73 and 74, respectively. The spacer layers 75 and 76 are made of conductive nonmagnetic materials.

Figure 8:
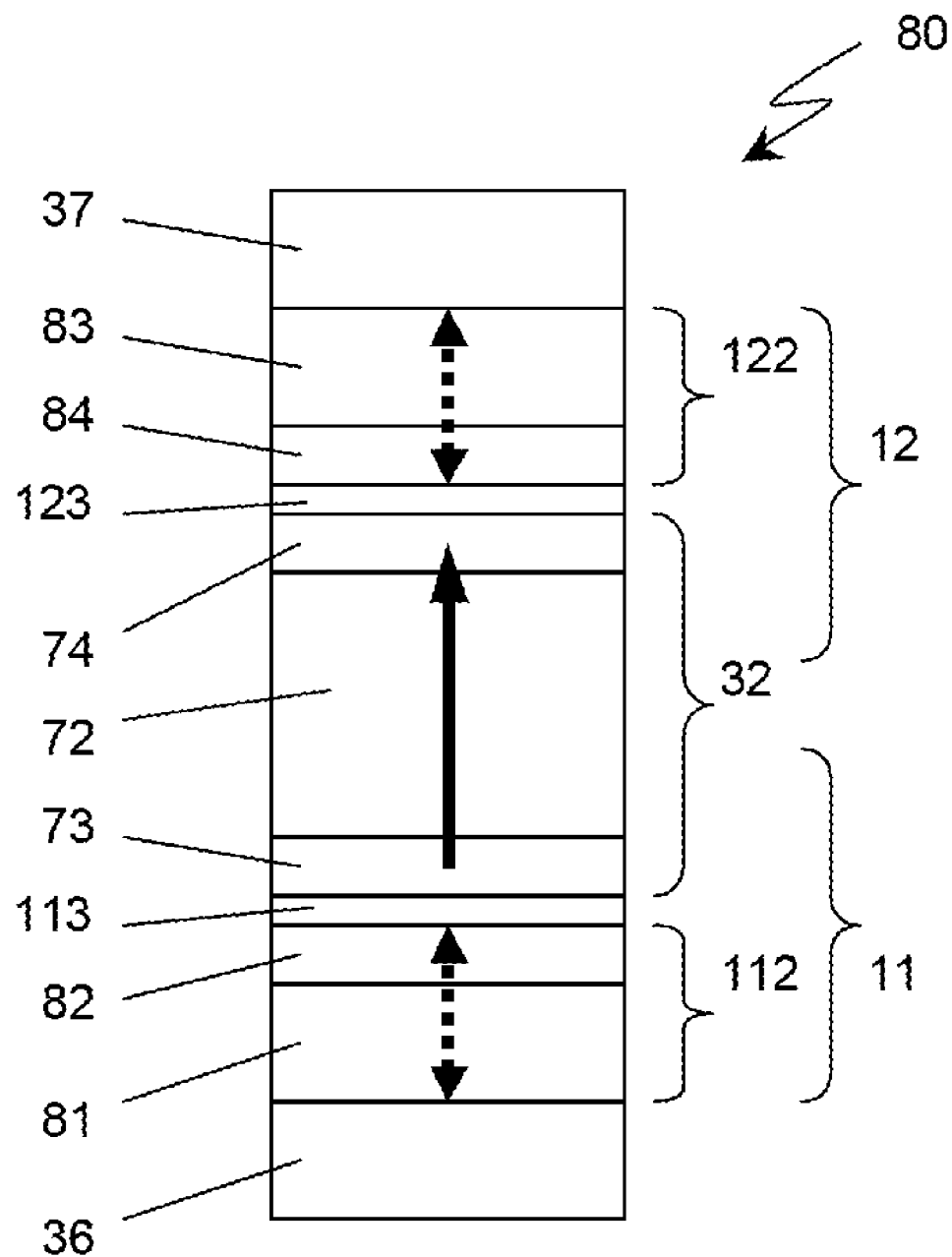
FIG. 8 shows a schematic cross-sectional view of multi-bit perpendicular MTJ element with enhanced spin polarization according to still another embodiment of the present invention.

FIG. 8 shows a MR element 80 with a reduced switching current. The free layer 112 comprises a multilayer structure composed of a soft magnetic layer 82 and a storage layer 81. The storage layer 81 is made of magnetic material with perpendicular magnetization and has a substantial magnetic coupling with the soft magnetic layer 82. The soft magnetic layer 82 is made of a soft magnetic material with, either perpendicular or in-plane anisotropy. The free layer 122 includes a soft magnetic layer 84 and a storage layer 83 having similar properties as the layers 81 and 82 of the free layer 112. A perpendicular orientation of magnetization in the soft magnetic layer 84 in the equilibrium state is provided by a strong exchange coupling with the storage layer 83. The bias magnetic field $H_B$ of a relatively low magnitude can cause a tilt of the magnetization in the soft magnetic layer 84 from its equilibrium position. It will result in a reduction of the spin-polarized current $I_S$ required for magnetization reversal in the reference layer 83 and in the entire free layer 122.

Figure 9:
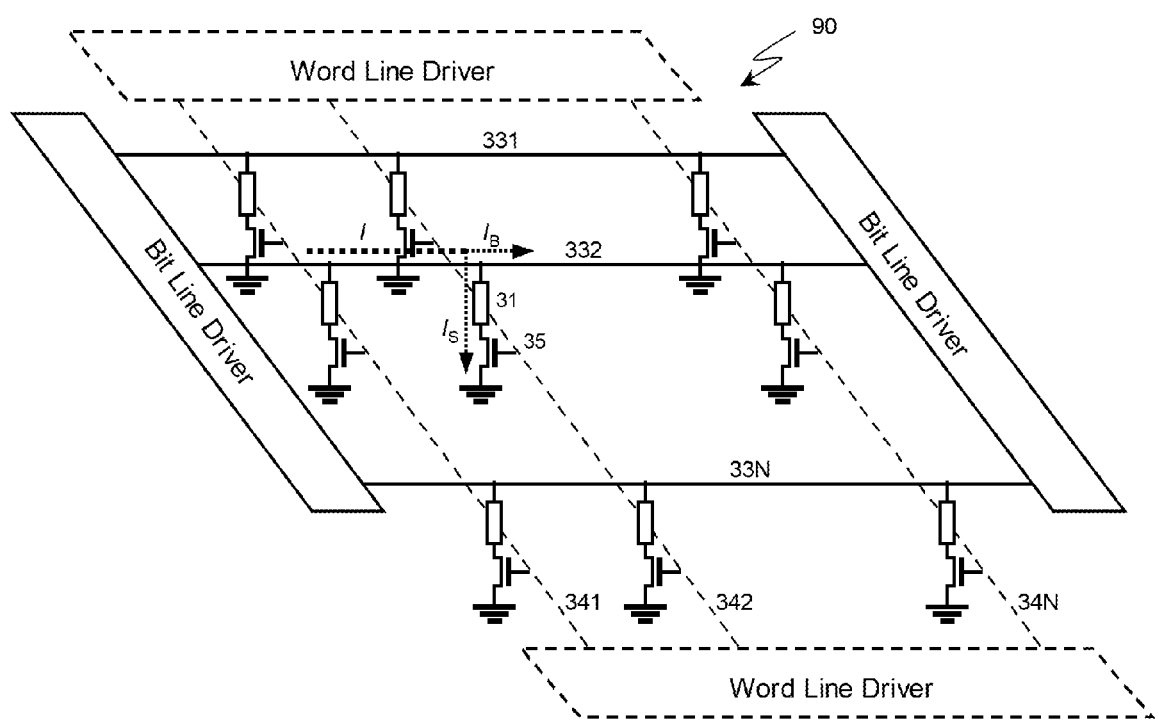
FIG. 9 is a schematic view of MRAM module including multi-bit memory cells shown in FIG. 3.

FIG. 9 shows a schematic view of MRAM module 90 comprising an array of memory cells 30 shown in FIG. 3, bit line drivers and word line drivers. The MR elements are located at the intersection of parallel conductive bit lines 331, 332 and 33N, with parallel word lines 341, 342 and 34N. Each MR element of the array can be selected individually according to a unique combination of the intersecting bit and word lines in vicinity of the element. For instance, to write a data to the MR element 31 located at the intersection of the bit line 332 and the word line 342 a pulse of the bias current $I_B$ of small magnitude is produced in the bit line 332 by bit line drivers. The current $I_B$ induces a bias magnetic field $H_B$ along the line 332 and causes a tilt of the magnetization in all MR elements adjacent the bit line 332 creating an issue of a half-selected cell. Since the bias field $H_B$ has a small magnitude it cannot alone reverse the magnetization in any of the half-selected MR elements disposed along the bit line 332. By applying a voltage pulse to a gate of the selection transistor 35 the MR element 31 located at the intersection of the line 332 and 342 will be selected and a pulse of the spin-polarized current $I_S$ will be produced in the MR element 31. Other transistors connected to the word line 342 will be remained closed since a bias voltage is not applied to other bit lines 331, . . . 33N. Hence a data could be written to the MR element 31 only located at the intersection of the lines 332 and 342. The combined effect of two superimposed pulses of the currents $I_B$ and $I_S$ will cause a reversal of the magnetization in the free layer of the MR element 31 only. The hybrid switching mechanism that combines a bias magnetic field with a spin-polarized current provides excellent cell selectivity in the array and low write current.

There is wide latitude for the choice of materials and their thicknesses within the embodiments of the present invention.

The pinned layers 32, 111 and 121 have a thickness of about 10-100 nm and more specifically of about 25-50 nm and coercivity measured along their easy axis above 1000 Oe and more specifically of about 3000-5000 Oe. The layers 32, 111 and 121 are made of magnetic material with perpendicular anisotropy such as Ni, Fe or Co-based alloys or their multilayers such as Co/Pt, Co/Pd, Co/Au, CoFe/Pt, Fe/Pt, Fe/Pd, Ni/Cu or similar.

The bit and word lines 33 and 34 are made of Cu, Al, Au, Ag, AlCu, Ta/Au/Ta, Cr/Cu/Cr, poly-Si and similar materials or their based laminates.

The seed 36 and cap 37 layers have a thickness of 1-100 nm and more specifically of about 5-25 nm. The layers are made of Ta, W, Ti, Cr, Ru, NiFe, NiFeCr, PtMn, IrMn or similar conductive materials or their based laminates.

The spacer layers 62 is made of conductive nonmagnetic material such as Ru, Cu, Re, Ag, Au or similar and their based alloys and laminates. The layer 62 has a thickness in a range from 0.5 nm to 100 nm.

The reference layer 72 has a thickness of 10-100 nm and more specifically of about 20-50 nm; and coercivity above 1000 Oe and more specifically of about 3000-5000 Oe. The reference layer 72 is made of magnetic material with a substantial perpendicular anisotropy such as Ni, Fe or Co-based alloys or multilayers such as Co/Pt, Co/Pd, Co/Au, CoFe/Pt, Fe/Pt, Fe/Pd, Ni/Cu or similar.

The spin-polarizing layers 73 and 74 have a thickness of 0.5-5 nm and a high spin polarization. They are made of soft magnetic materials with a coercivity of about 1-200 Oe. The spin polarizing layers 73 and 74 are made of Ni, Fe, Co, their based alloys such as NiFe, CoFe, CoFeB, CoPt, FePt, CoPtCu, FeCoPt and similar or their based laminates such as CoFe/Pt, CoFeB/Pd and similar. The material of the spin-polarizing layers 73 and 74 can have either in-plane or perpendicular anisotropy.

The spacer layers 75 and 76 have a thickness of 0.3-5 nm and more specifically in a range from 0.5 to 2.5 nm. The spacer layers 75 and 76 are made of conductive nonmagnetic materials such as Ru, Cu, Ag, Ag, Re or similar, their based alloys and laminates.

The storage layers 81 and 83 have a thickness of 5-25 nm and more specifically of about 8-15 nm; and coercivity less than 2000 Oe and more specifically of about 200-500 Oe. The storage layers 81 and 83 are made of magnetic materials with a substantial perpendicular anisotropy such as Fe, Ni or Co-based alloys or multilayers such as Co/Pt, Co/Pd, Co/Au, CoFe/Pt, Fe/Pt, Fe/Pd, Ni/Cu or similar.

The soft magnetic layers 82 and 84 are 0.5-10 nm thick and are made of a soft magnetic material having a substantial spin polarization and coercivity of about 1-200 Oe such as Ni, Fe, Co-based alloys CoFe, CoFeB, NiFe, Co, Fe, CoPt, FePt, CoPtCu, FeCoPt and similar or their based laminates such as CoFe/Pt, CoFeB/Pd and similar. The materials of the soft magnetic layers 82 and 84 can have either in-plane or perpendicular anisotropy.

The free layers 112 and 122 have a thickness of about 1-30 nm and more specifically of about 5-15 nm and coercivity less than 1000 Oe and more specifically of about 100-300 Oe. The layer 113 and 123 are made of soft magnetic materials with a perpendicular anisotropy such as Ni, Fe or Co-based alloys or multilayers such as Co/Pt, Co/Pd, Co/Au, CoFe/Pt, Fe/Pt, Fe/Pd, Ni/Cu or similar.

The tunnel barrier layers 113 and 123 have a thickness of about 0.5-25 nm and more specifically of about 0.5-1.5 nm. The tunnel barrier layers are made of $MgO$, $Al_2O_3$, $Ta_2O_5$, $TiO_2$, Mg—MgO and similar materials, their based laminates or semiconductors.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. A magnetic memory cell comprising:
    a magnetic tunnel junction element including a first free layer comprising a first switching current and a changeable magnetization directed substantially perpendicular to a layer plane in its equilibrium state, a second free layer comprising a second switching current and a changeable magnetization directed substantially perpendicular to a layer plane in its equilibrium state, a first tunnel barrier layer, a second tunnel barrier layer, and a pinned layer comprising a fixed magnetization directed substantially perpendicular to a layer plane, the pinned layer is disposed between the first and second free layers and is separated from the free layers by one of the tunnel barrier layers,
    a selection transistor electrically connected to a word line, and
    a bit line intersecting the word line, the magnetic tunnel junction element is disposed between the bit line and the selection transistor and is electrically connected to the bit line and to the selection transistor.

2. The magnetic memory cell of claim 1 wherein the first switching current is substantially different from the second switching current.

3. The magnetic memory cell of claim 1 wherein the free layer comprises at least:
- a storage layer comprising a first coercivity and a magnetization oriented substantially perpendicular to a layer plane, and
- a soft magnetic layer comprising a second coercivity and a magnetization oriented substantially perpendicular to a layer plane in its equilibrium state, the soft magnetic layer is disposed between the tunnel barrier layer and the storage layer and is substantially magnetically coupled with the storage layer; the second coercivity is substantially lower than the first coercivity.

4. The magnetic memory cell of claim 3 wherein the soft magnetic layer comprises an in-plane anisotropy.

5. The magnetic memory cell of claim 1 wherein the pinned layer comprises at least:
- a first and second spin polarizing layer comprising a fixed magnetization oriented substantially perpendicular to a layer plane, and
- a reference layer comprising a fixed magnetization oriented substantially perpendicular to a layer plane, the reference layer is disposed between the first and second spin polarizing layers and is substantially magnetically coupled with the first and second spin polarizing layers.

6. The magnetic memory cell of claim 5 wherein the first and second spin polarizing layers comprise an in-plane anisotropy.

7. The magnetic memory cell of claim 1 wherein the pinned layer comprises:
- a first pined layer comprising a magnetization oriented substantially perpendicular to a layer plane;
- a second pinned layer comprising a magnetization oriented substantially perpendicular to a layer plane, and
- a nonmagnetic spacer layer disposed between the first and second pinned layers.

8. A method of writing to a magnetic memory cell comprising:
- providing a magnetic tunnel junction element including a first free layer comprising a first switching current, a second free layer comprising a second switching current, each of the free layers comprising a changeable magnetization directed perpendicular to a layer plane in its equilibrium state, a first and second tunnel barrier layer, and a pinned layer comprising a fixed magnetization directed substantially perpendicular to a layer plane, the pinned layer is disposed between the first and second free layers and is separated from the free layers by one of the tunnel barrier layers, the magnetic tunnel junction element being disposed between a bit line and a selection transistor and electrically coupled to the bit line and to the selection transistor, the selection transistor being electrically coupled to a word line intersecting the bit line;
- driving a bias current pulse through the bit line in a proximity to but not through the magnetic tunnel junction element for producing a bias magnetic field along a hard magnetic axis of the pinned, first free and second free layers, and
- driving a switching current pulse through the magnetic tunnel junction element along an easy axis of the pinned, first free and second free layers for producing a spin momentum transfer, the switching current pulse substantially superimposes the bias current pulse.

9. The method of claim 8 wherein the free layer comprises at least:
- a storage layer comprising a first coercivity and a magnetization oriented substantially perpendicular to a layer plane, and
- a soft magnetic layer comprising a second coercivity and a magnetization oriented substantially perpendicular to a layer plane in its equilibrium state, the soft magnetic layer is disposed between the tunnel barrier layer and the storage layer and is substantially magnetically coupled with the storage layer; the second coercivity is substantially lower than the first coercivity.

10. The method of claim 9 wherein the soft magnetic layer comprises an in-plane anisotropy.

11. The method of claim 9 wherein the magnetization of the soft magnetic layer is tilted from its equilibrium state by the bias magnetic field.

12. The method of claim 8 wherein the pinned layer comprises at least:
- a first and second spin polarizing layer comprising a fixed magnetization oriented substantially perpendicular to a layer plane, and
- a reference layer comprising a fixed magnetization oriented substantially perpendicular to a layer plane, the reference layer is disposed between the first and second spin polarizing layers and is substantially magnetically coupled with the first and second spin polarizing layers.

13. The method of claim 12 wherein the first and second spin polarizing layer comprises an in-plane anisotropy.

14. The method of claim 8 wherein the pinned layer comprises:
- a first pined layer comprising a magnetization oriented substantially perpendicular to a layer plane;
- a second pinned layer comprising a magnetization oriented substantially perpendicular to a layer plane, and
- a nonmagnetic spacer layer disposed between the first and second pinned layers.

* * * * *